United States Patent
Eun et al.

(10) Patent No.: US 7,541,252 B2
(45) Date of Patent: Jun. 2, 2009

(54) METHODS OF FABRICATING A SEMICONDUCTOR DEVICE INCLUDING A SELF-ALIGNED CELL DIODE

(75) Inventors: Sung-Ho Eun, Ansan-si (KR); Jae-Hee Oh, Seongnam-si (KR); Jae-Hyun Park, Yongin-si (KR); Jung-In Kim, Seoul (KR); Seung-Pil Ko, Suwon-si (KR); Yong-Tae Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 11/770,764

(22) Filed: Jun. 29, 2007

(65) Prior Publication Data

US 2008/0113469 A1     May 15, 2008

(30) Foreign Application Priority Data

Nov. 9, 2006 (KR) .................. 10-2006-0110549

(51) Int. Cl.
*H01L 21/20* (2006.01)

(52) U.S. Cl. .......................... 438/381; 257/E21.364; 257/E21.366

(58) Field of Classification Search ............ 438/48, 438/93, 95, 133, 382, 384, 385, 380, 381; 257/E21.364, E21.366

See application file for complete search history.

(56) References Cited

U.S. PATENT DOCUMENTS

| | | | |
|---|---|---|---|
| 5,534,711 A * | 7/1996 | Ovshinsky et al. | 257/3 |
| 6,579,760 B1 | 6/2003 | Lung | |
| 6,784,046 B2 | 8/2004 | Gonzalez et al. | |
| 2005/0207248 A1 | 9/2005 | Hsu | |
| 2006/0237756 A1 * | 10/2006 | Park et al. | 257/296 |

FOREIGN PATENT DOCUMENTS

| | | |
|---|---|---|
| KR | 10-2006-0094424 | 8/2006 |
| KR | 10-2006-0110559 | 10/2006 |
| KR | 10-2007-0079647 | 8/2007 |
| WO | 03/021693 | 3/2003 |
| WO | 2004/017437 | 2/2004 |

\* cited by examiner

*Primary Examiner*—Brook Kebede
(74) *Attorney, Agent, or Firm*—Volentine & Whitt, PLLC

(57) ABSTRACT

A method of fabricating a semiconductor device includes forming a conductive layer on a semiconductor substrate, forming an insulating layer on the conductive layer, forming a word line and isolation trenches by patterning the insulating layer and the conductive layer, forming an isolation layer that fills the isolation trenches, forming a cell contact hole in the insulating layer such that the cell contact hole is self-aligned with the word line and exposes the word line, and forming a cell diode in the cell contact hole.

19 Claims, 20 Drawing Sheets

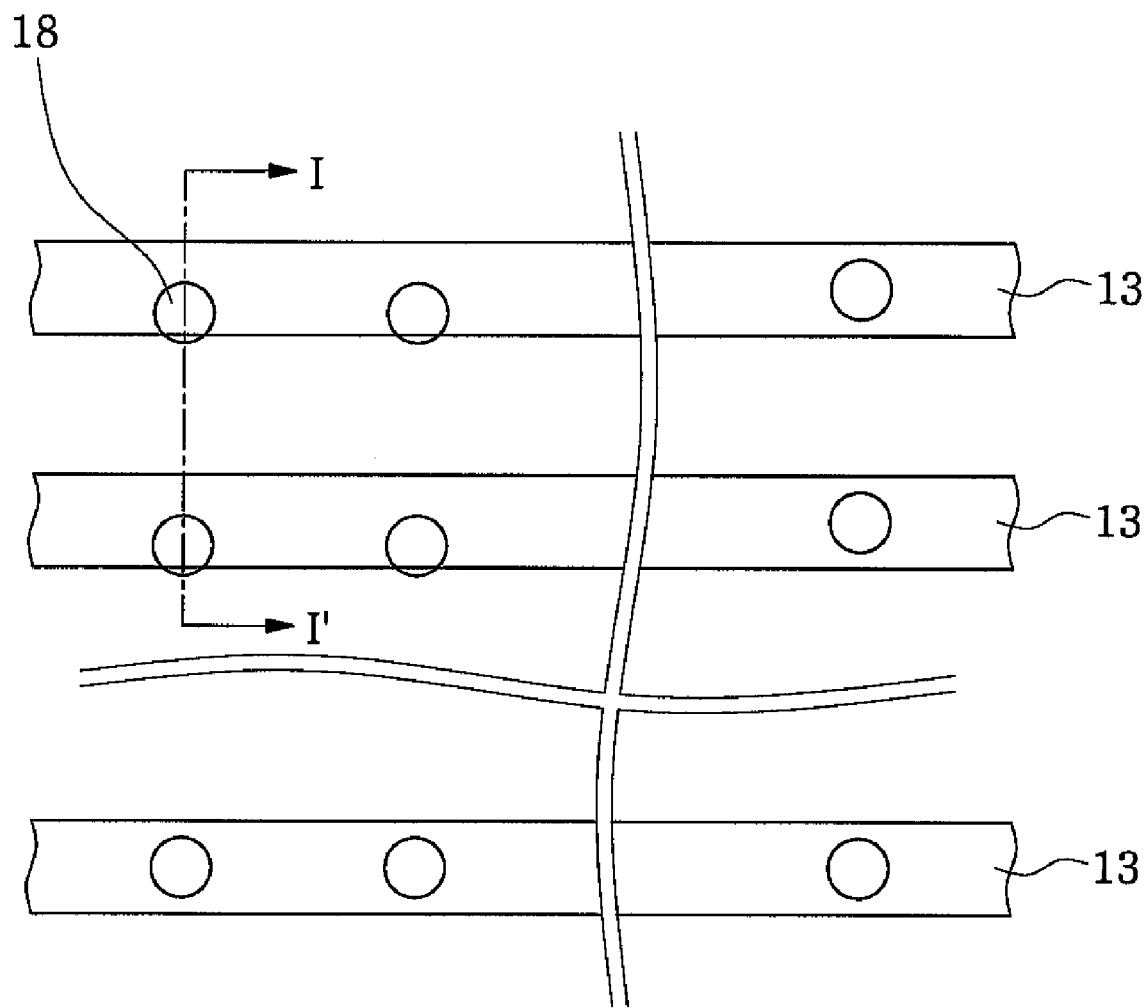

METHODS OF FABRICATING A SEMICONDUCTOR DEVICE INCLUDING A SELF-ALIGNED CELL DIODE

CROSS-REFERENCE TO RELATED APPLICATION

A claim of priority is made to Korean Patent Application No. 10-2006-0110549, filed Nov. 09, 2006, the contents of which are hereby incorporated by reference in their entirety.

BACKGROUND OF THE INVENTION

1. Field of the Disclosure

The present disclosure relates to a method of fabricating a semiconductor device and, more particularly, to a method of fabricating a semiconductor device having a self-aligned cell diode and a method of fabricating a phase change memory device using the same.

2. Description of the Related Art

Phase change memory devices are widely used as non-volatile semiconductor memory devices. As non-volatile memory devices, phase change memory devices retain store data even in the event of a power loss. Usually, a phase change memory device includes a plurality of phase change memory cells. Each phase change memory cell may include a current switching device and a data storage element that are electrically connected with each other. In particular, the data storage element may have a lower electrode and an upper electrode. The lower electrode of the data storage element may electrically connect with the current switching device. Furthermore, the upper and lower electrodes may have a phase change material pattern therebetween The lower electrode generally acts as a heater in the phase change memory device. Accordingly, when a current flows from the current switching device to the data storage element, the lower electrode may act as a heater to generate Joule heat at a contact surface of the phase change material. This generated Joule heat may cause the phase change material to be converted to an amorphous state or a crystalline state.

FIGS. 1A and 2A are plan views illustrating a conventional method of fabricating a phase change memory device, and FIGS. 1B and 2B are cross-sectional views showing a phase change memory device taken along line I-I' of FIG. 1A and line II-II' of FIG. 2A, respectively.

Referring to FIGS. 1A and 1B, a semiconductor substrate 10 may include an active region 12 and an isolation layer 14. The isolation layer 14 may be formed in the semiconductor substrate 10 to define or surround the active region 12. Furthermore, a word line 13 may be formed in or on the active region 12. The word line 13 may be a diode including a conductive pattern structure on the active region 12 or a impurity diffusion region in the active region 12. Also, a lower insulating layer 16 may be formed over the semiconductor substrate 10.

The lower insulating layer 16 may have at least one cell contact hole 18. The cell contact hole 18 may be formed by using well known photolithography and etching processes. In addition, the cell contact hole 18 may penetrate the lower insulating layer 16 to expose the word line 13. The cell contact hole 18 may have a circle shape in a plan view as shown in FIG. 1A.

Referring to FIGS. 2A and 2B, a cell diode 20 may be formed to partly fill the cell contact hole 18. The cell diode 20 may have a first semiconductor pattern 20a and a second semiconductor pattern 20b. Furthermore, the first and second semiconductor patterns 20a and 20b may be of conductive types that are different from each other. Moreover, a cell diode electrode 22 and a lower electrode 24 may be sequentially formed to sufficiently fill the cell contact hole 18 on the second semiconductor pattern 20b. Next, a phase change material pattern 26 may be formed on the lower insulating layer 16 to contact the lower electrode 24. In addition, an upper insulating layer 30 may be formed on the lower insulating layer 16 to cover the phase change material pattern 26. The upper insulating layer 30 may have an upper electrode 28. Furthermore, the upper electrode 28 may penetrate the upper insulating layer 30 to contact the phase change material pattern 26. In addition, a bit line 32 is formed on the upper insulating layer 30 to contact the upper electrode 28.

The cell diode electrode 22, the lower electrode 24, the upper electrode 28, and the bit line 32 may form a selective phase change memory cell 35 in the phase change memory device together with the phase change material pattern 26. The phase change material pattern 26 may be formed using a chalcogenide material layer. The chalcogenide material layer may formed of a material such as, for example, a germanium stibium tellurium (GeSbTe) layer (hereinafter, referred to as a GST layer).

During the operation of the phase change memory device, a current flows toward the phase change material pattern 26 through the lower electrode 24 or the upper electrode 28. If current flows through the lower electrode 24, the current may generate Joule heat at a contacting surface between the lower electrode 24 and the phase change material pattern 26. This Joule heat may change the existing state of the phase change material pattern 26 to a crystalline state or an amorphous state. Furthermore, by changing the state of the phase change material pattern 26, the desired data is stored in the phase change memory cell.

While the conventional semiconductor memory device fabrication method may be used to fabricate a phase change memory device, it suffers from various shortcomings. For example, in the conventional method, the cell contact hole 18 may misalign with the word line 13 such that it deviates from the word line 13. This misalignment may occur due to defects in the photolithography process. Accordingly, a poor contact may occur between the word line 13 and the cell diode 20 in the cell contact hole 18.

For example, as shown in FIGS. 1A and 1B, the cell contact hole 18 may only partially overlap the word line 13 because of defects in the photolithography. Due to only this partial overlap, the cell diode 20 may have a relatively small contacting surface with the word line 13 as compared to the desirable scenario of having the cell contact hole 18 sufficiently overlap the word line 13. Because of this relatively small contact surface between the cell diode 20 and the word line 13, the series resistance between the word line 13 and the lower electrode 22 may increase through the cell contact hole 18. This increased resistance between the word line 13 and the lower electrode 22 may have undesirable effects on the phase change memory device 35.

The present disclosure is directed towards overcoming one or more limitations of the conventional semiconductor device fabrication method.

SUMMARY

One aspect of the present disclosure includes a method of fabricating a semiconductor device. The method includes forming a conductive layer on a semiconductor substrate, forming an insulating layer on the conductive layer, forming a word line and isolation trenches by patterning the insulating layer and the conductive layer, forming an isolation layer that fills the isolation trenches, forming a cell contact hole in the insulating layer such that the cell contact hole is self-aligned with the word line and exposes the word line, and forming a cell diode in the cell contact hole.

Another aspect of the present disclosure includes a method of fabricating a phase change memory device. The method includes forming a conductive layer on a semiconductor substrate, forming a lower insulating layer on the conductive layer, forming a first preliminary hard mask pattern on the lower insulating layer, etching the lower insulating layer and the conductive layer using the first preliminary hard mask pattern as an etch mask to form a word line and a plurality of isolation trenches, forming an isolation layer that fills the isolation trenches, patterning the first preliminary hard mask pattern to form a first hard mask pattern, forming a second hard mask layer on the isolation layer and the lower insulating layer to surround the first hard mask pattern, removing the first hard mask pattern from the second hard mask layer to form a second hard mask pattern, etching the lower insulating layer using the second hard mask pattern as an etch mask to form a cell contact hole, the cell contact hole being self-aligned with the word line and exposing the word line, and forming a cell diode at least partially filling the cell contact hole.

BRIEF DESCRIPTION OF THE DRAWINGS

The foregoing and other features of the invention will be apparent from the more particular description of a preferred embodiment of the invention, as illustrated in the accompanying drawing. The drawing is not necessarily to scale, emphasis instead being placed upon illustrating the principles of the invention.

FIGS. 1A and 2A are plan views illustrating a conventional method of fabricating a phase change memory device.

DETAILED DESCRIPTION

Figure 1B:
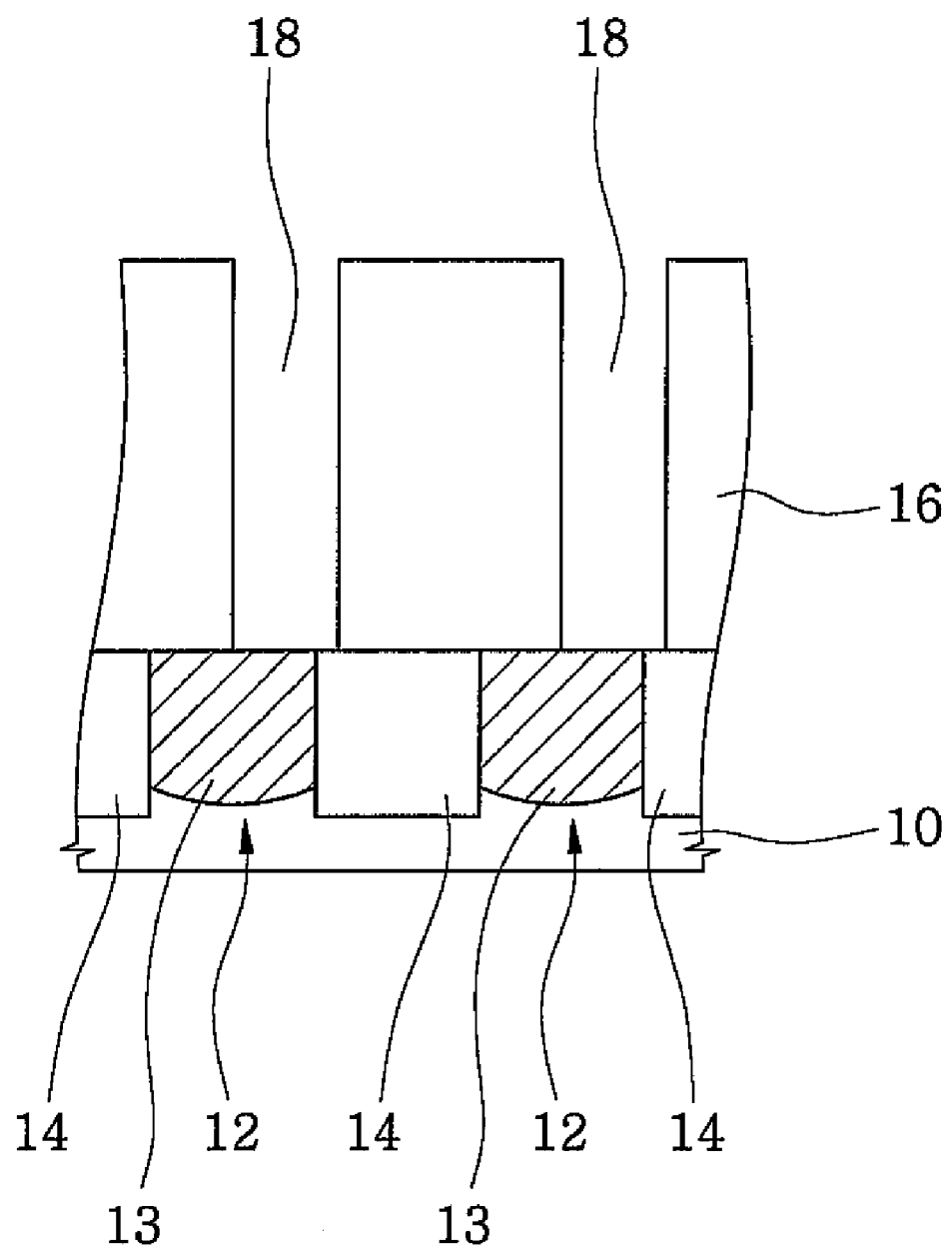
FIGS. 1B and 2B are cross-sectional views showing a phase change memory device taken along line I-I' of FIG. 1A and line II-II' of FIG. 2A, respectively.
Figure 2A:
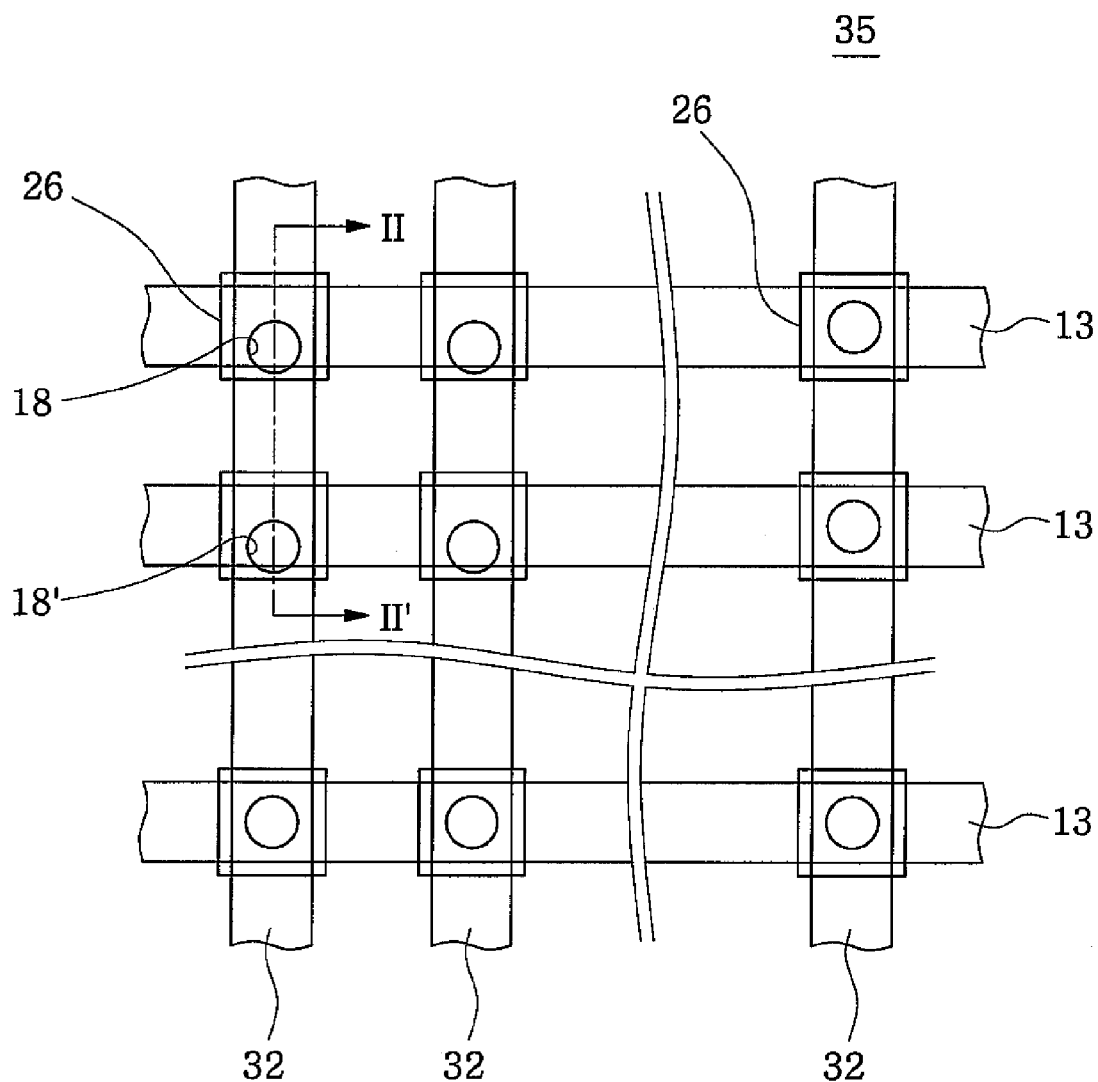
Figure 2B:
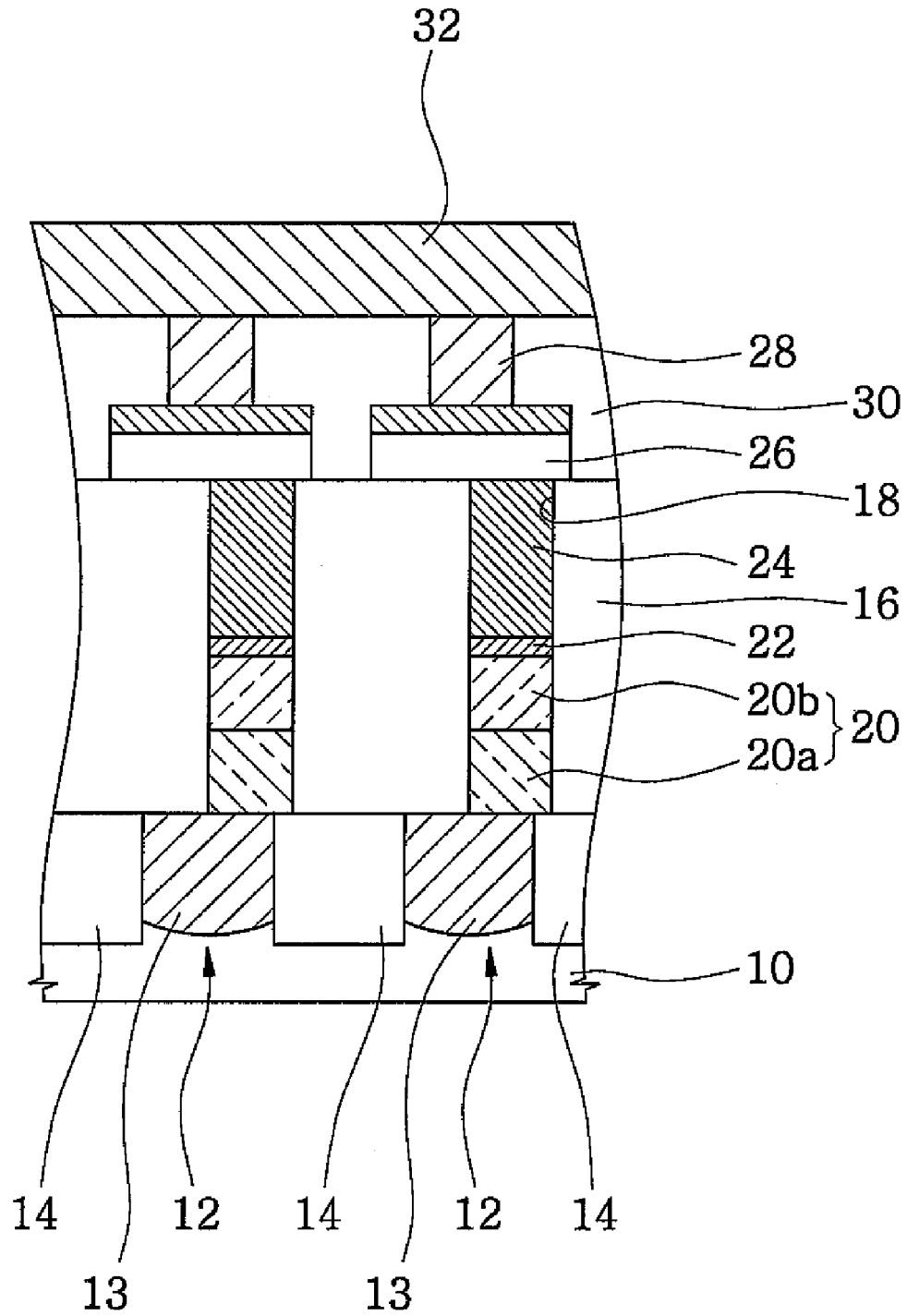

The present disclosure will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on other layer or on a substrate, which means that the layer may be formed on the other layer or on the substrate, or a third layer may be interposed between the layer and the other layer or the substrate. Like numbers refer to like elements throughout the specification.

Figure 3:
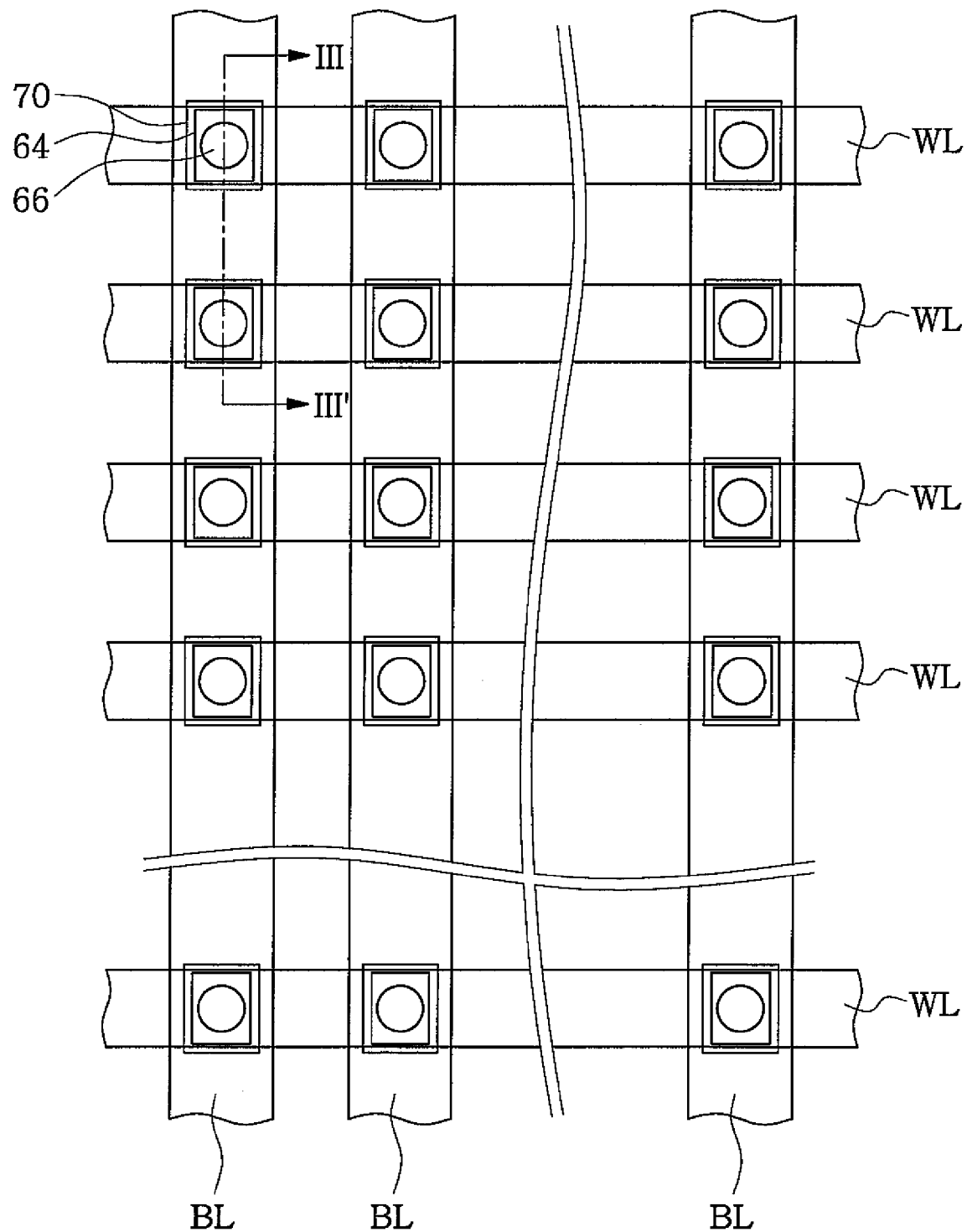
FIG. 3 is a plan view of a semiconductor device according to an exemplary disclosed embodiment.
Figure 4A:
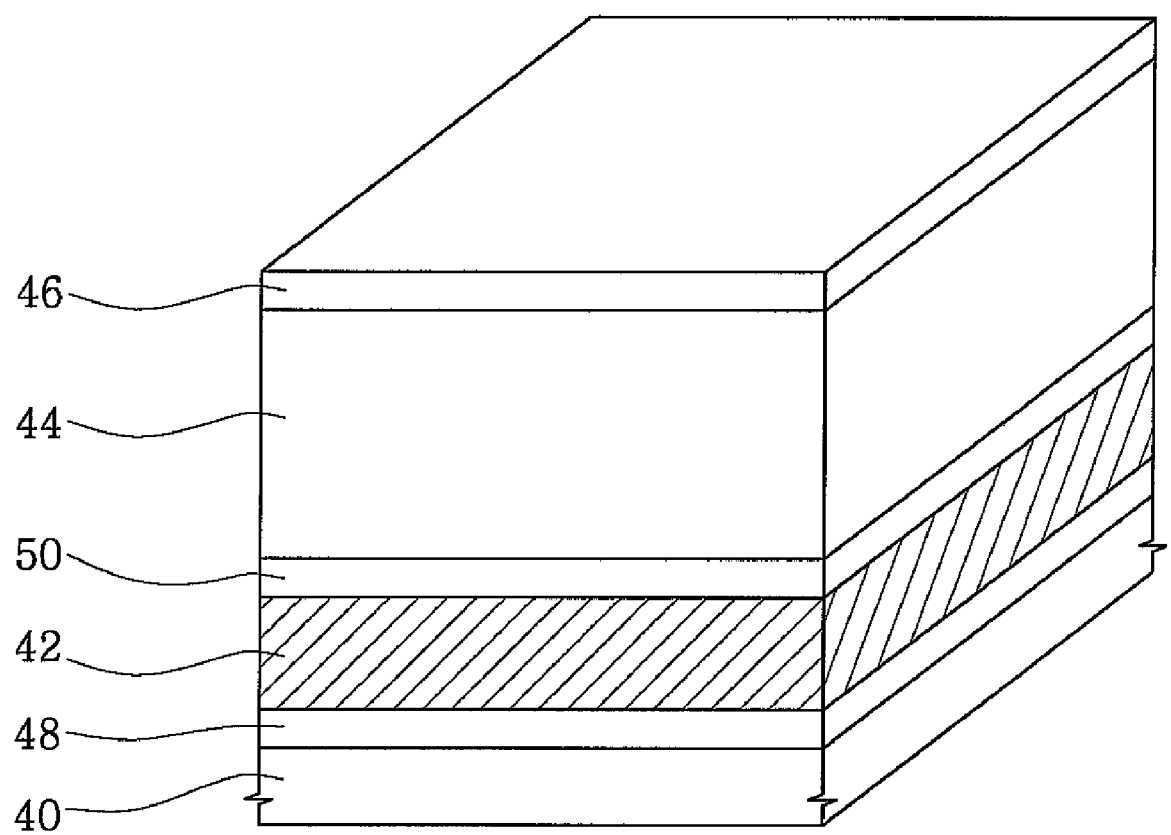
FIGS. 4A to 4O are cross-sectional views illustrating a method of fabricating a semiconductor device according to an exemplary disclosed embodiment.

FIG. 3 is a plan view of a semiconductor device according to an exemplary disclosed embodiment. FIGS. 4A to 4O are cross-sectional views illustrating a method of fabricating a semiconductor device according to an exemplary disclosed embodiment.

Referring to FIGS. 3 and 4A, in an exemplary method of fabricating a semiconductor device, a semiconductor substrate 40 is first prepared. Next, a conductive layer 42, a lower insulating layer 44, and a first hard mask layer 46 are sequentially stacked on the semiconductor substrate 40. The conductive layer 42 may be formed of a metal layer such as, for example, aluminum, tungsten, titanium, or tantalum. Alternatively, the conductive layer 42 may be formed of a doped polysilicon layer. Alternatively, the conductive layer 42 may be formed of an impurity region into which impurity ions are implanted based on the type of region of the semiconductor substrate 40. For example, when the semiconductor substrate 40 is a p-type semiconductor substrate, the conductive layer 42 may be formed by implanting n-type impurity ions.

Alternatively, the conductive layer 42 may be formed by forming an epitaxial semiconductor layer on the semiconductor substrate 40 and then implanting impurity ions into the epitaxial semiconductor layer.

The lower insulating layer 44 may be formed of an insulating layer such as, for example, a silicon oxide layer. Furthermore, the first hard mask layer 46 may be formed of a silicon nitride layer.

A buffer layer 48 may be formed between the semiconductor substrate 40 and the conductive layer 42. In an exemplary embodiment, when the conductive layer 42 is formed of an impurity region and the buffer layer 48 is formed between the semiconductor substrate 40 and the conductive layer 42, the buffer layer 48 may be formed of an impurity region having a different conductivity type from the conductive layer 42. The buffer layer 48 may act to insulate the conductive layer 42 from the substrate 40.

An etch stop layer 50 may be formed between the conductive layer 42 and the lower insulating layer 44. Furthermore, the etch stop layer 50 may be formed to have an etch selectivity with respect to the lower insulating layer 44. In an exemplary embodiment, the etch stop layer 50 may be formed of a silicon nitride layer.

Figure 4B:
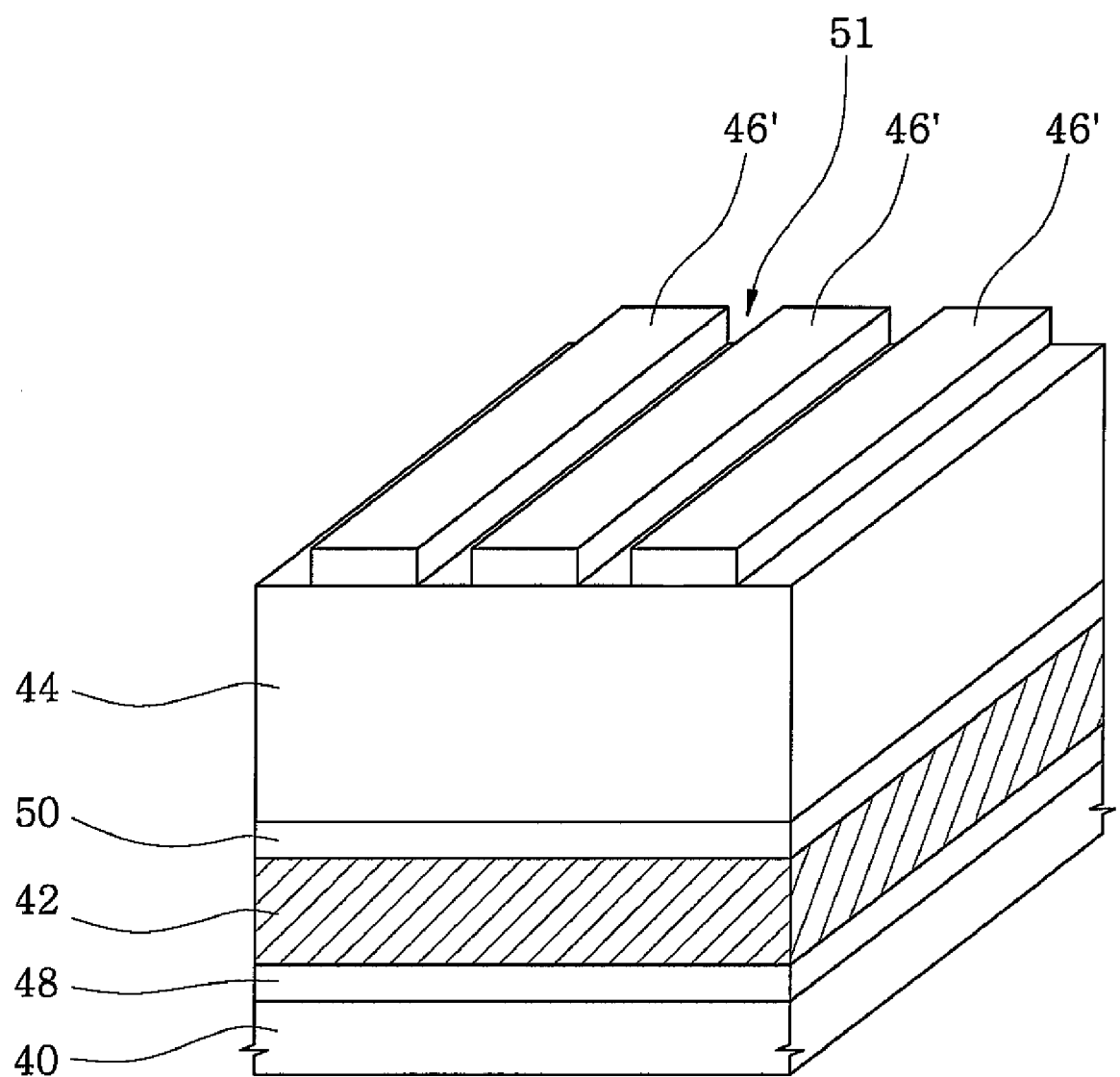

Referring to FIGS. 3 and 4B, the first hard mask layer 46 is patterned to form first preliminary hard mask patterns 46' on the lower insulating layer 44. The first preliminary hard mask patterns 46' may have several line shapes spaced apart from each other. In this case, an upper surface of the lower insulating layer 44 is exposed through openings 51 formed between the first preliminary hard mask patterns 46'. In addition, the first preliminary hard mask patterns 46' may be formed to have substantially the same widths as word lines to be formed in a subsequent process.

Figure 4C:
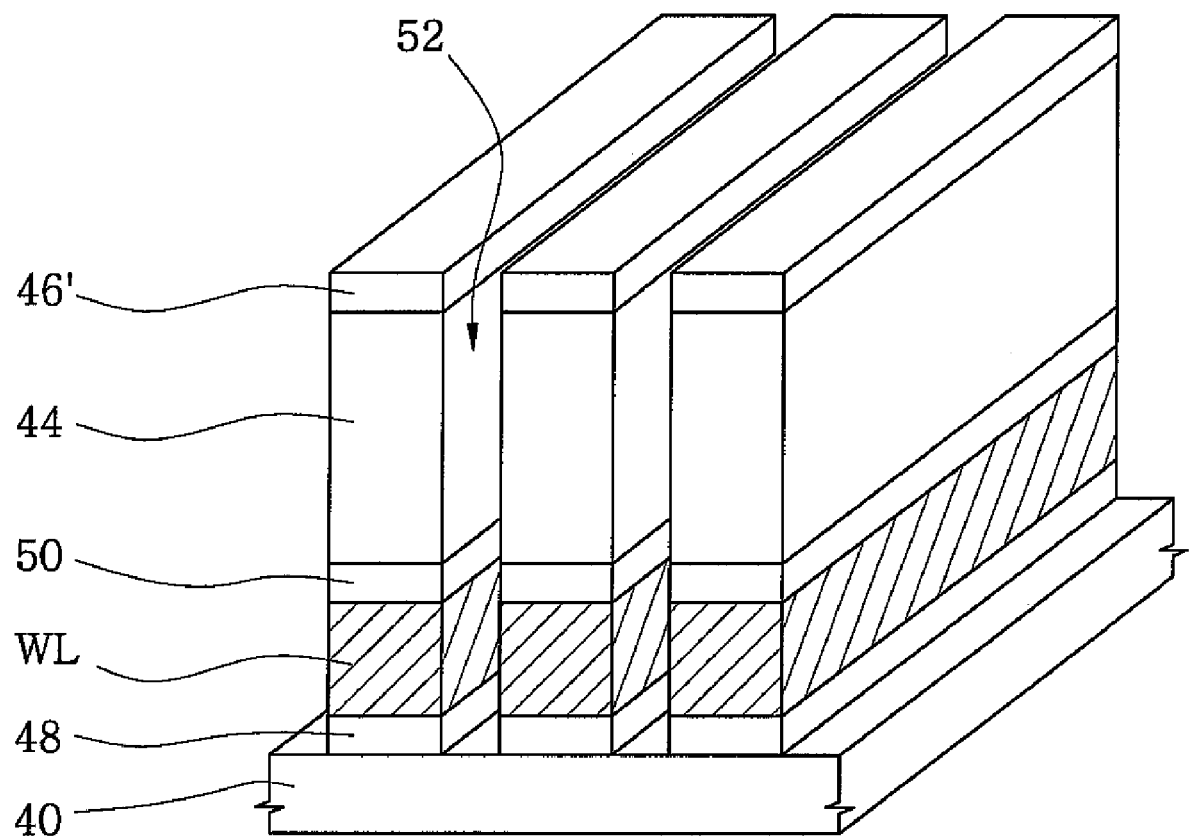

Referring to FIGS. 3 and 4C, the lower insulating layer 44 and the conductive layer 42 are sequentially etched using the first preliminary hard mask patterns 46' as an etch mask. The etch stop layer 50 is also selectively etched when the etch stop layer 50 is formed between the conductive layer 42 and the lower insulating layer 44. In addition, the buffer layer 48 may also be selectively etched by the etching process when the buffer layer 48 is formed between the semiconductor substrate 40 and the conductive layer 42. Accordingly, isolation trenches 52 are formed to expose an upper surface of the semiconductor substrate 40 while word lines WL defined by the isolation trenches 52 are formed. That is, the word lines WL are spaced apart from one another by the isolation trenches 52.

Figure 4D:
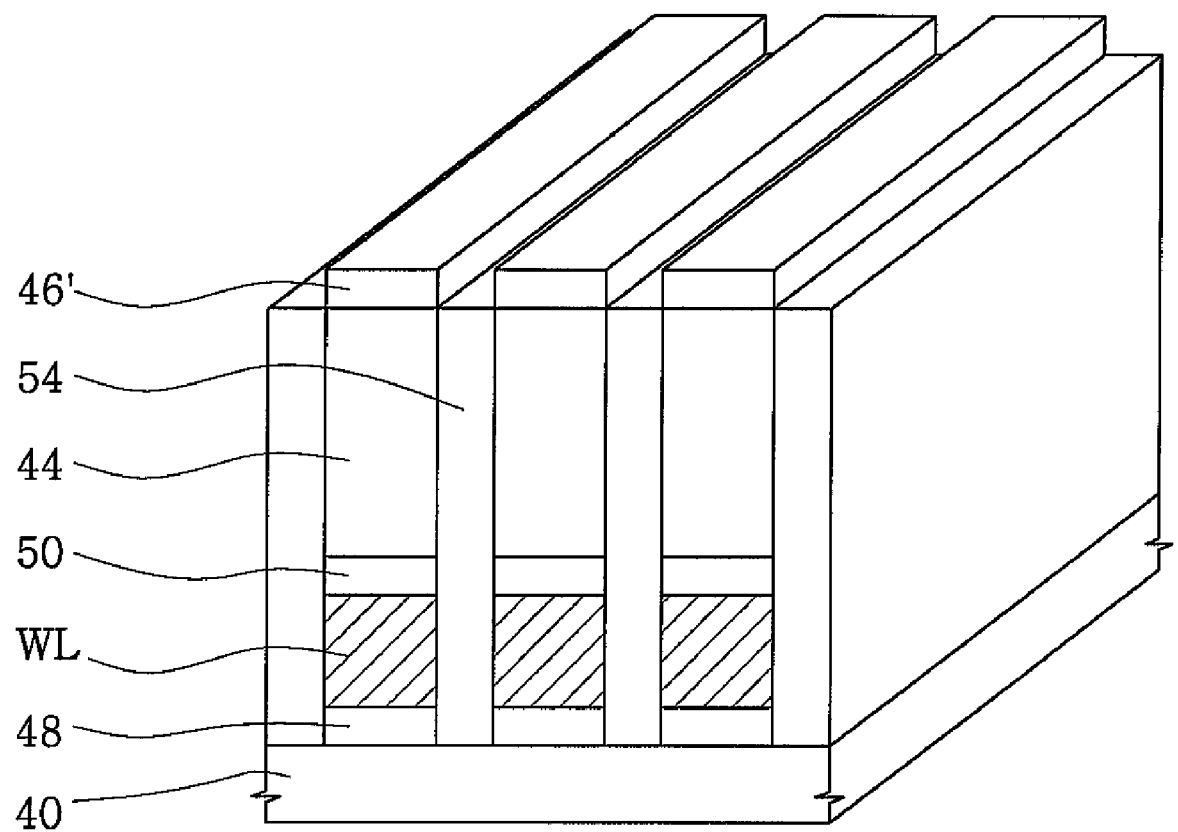

Referring to FIGS. 3 and 4D, an insulating layer is formed on the substrate having the first preliminary hard mask patterns 46' and the isolation trenches 52. Specifically, the insulating layer is etched using an etch-back technique to expose the first preliminary hard mask patterns 46' and simultaneously form an isolation layer 54 filling the isolation trenches 52. In an exemplary embodiment, the isolation layer 54 may be disposed at the substantially same level as the upper surface of the lower insulating layer 44.

The isolation layer 54 may be formed of an insulating layer such as, for example, a silicon oxide layer. Accordingly, widths of the word lines WL are defined by the isolation layer 54.

Figure 4E:
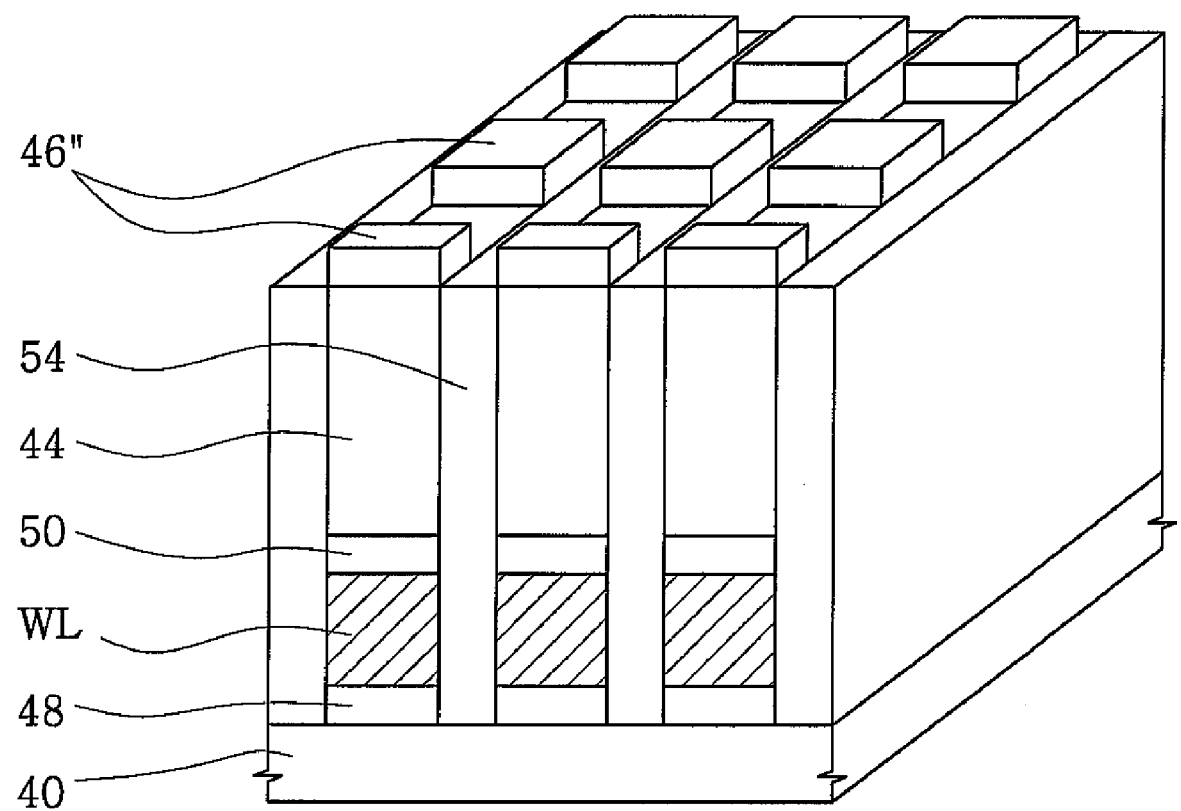

Referring to FIGS. 3 and 4E, the first preliminary hard mask patterns 46' are patterned to form first hard mask patterns 46". The first hard mask patterns 46" may be arranged two-dimensionally along rows and columns. In this case, the first hard mask patterns 46" have substantially the same widths as the widths of the word lines WL. In addition, the first hard mask patterns 46" may have rectangular shapes when seen in a plan view.

Figure 4F:
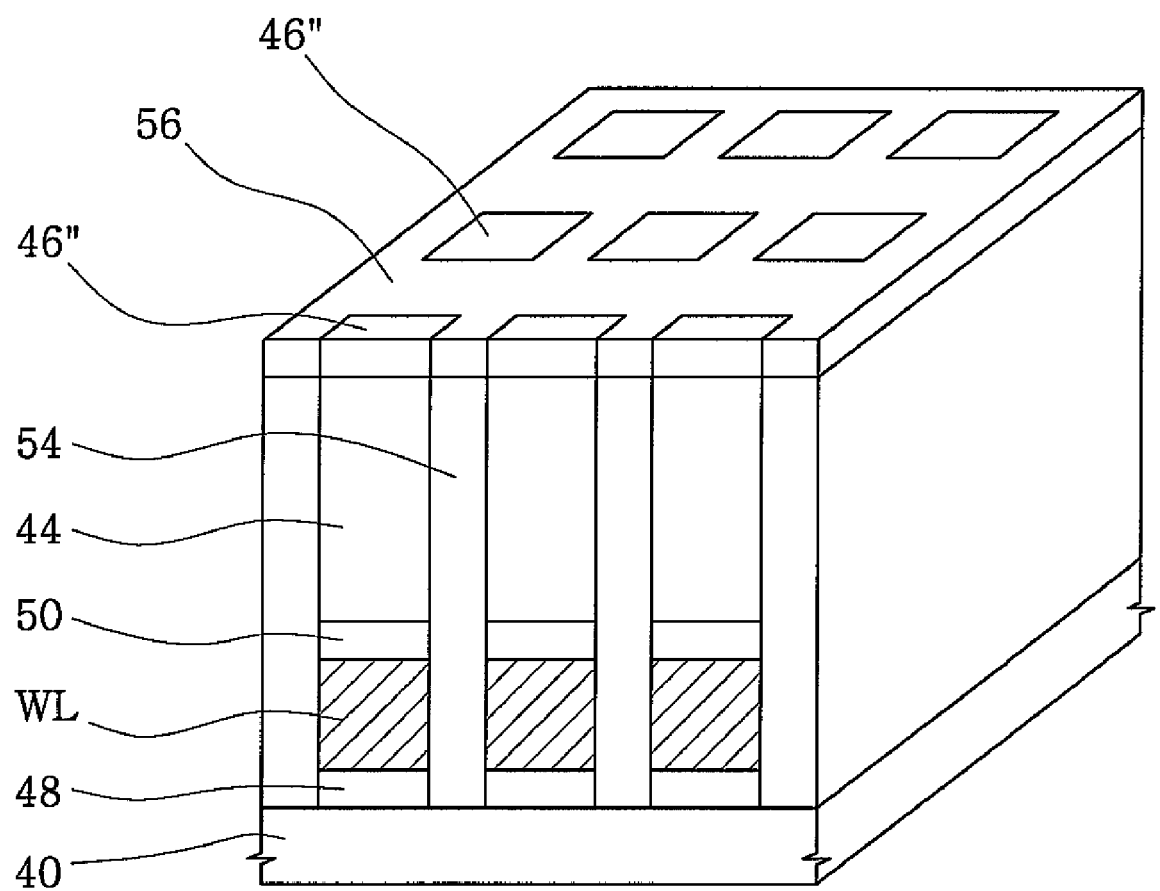

Referring to FIGS. 3 and 4F, a second hard mask layer 56 is formed to cover the substrate having the first hard mask patterns 46". The second hard mask layer 56 may have an etch selectivity with respect to the first hard mask layer 46. For example, when the first hard mask layer 46 is formed of a silicon nitride layer, the second hard mask layer 56 may be formed of a polysilicon layer. Subsequently, the second hard mask layer 56 is planarized using, for example, a chemical mechanical polishing (CMP) technique, to expose upper surfaces of the first hard mask patterns 46".

Figure 4G:
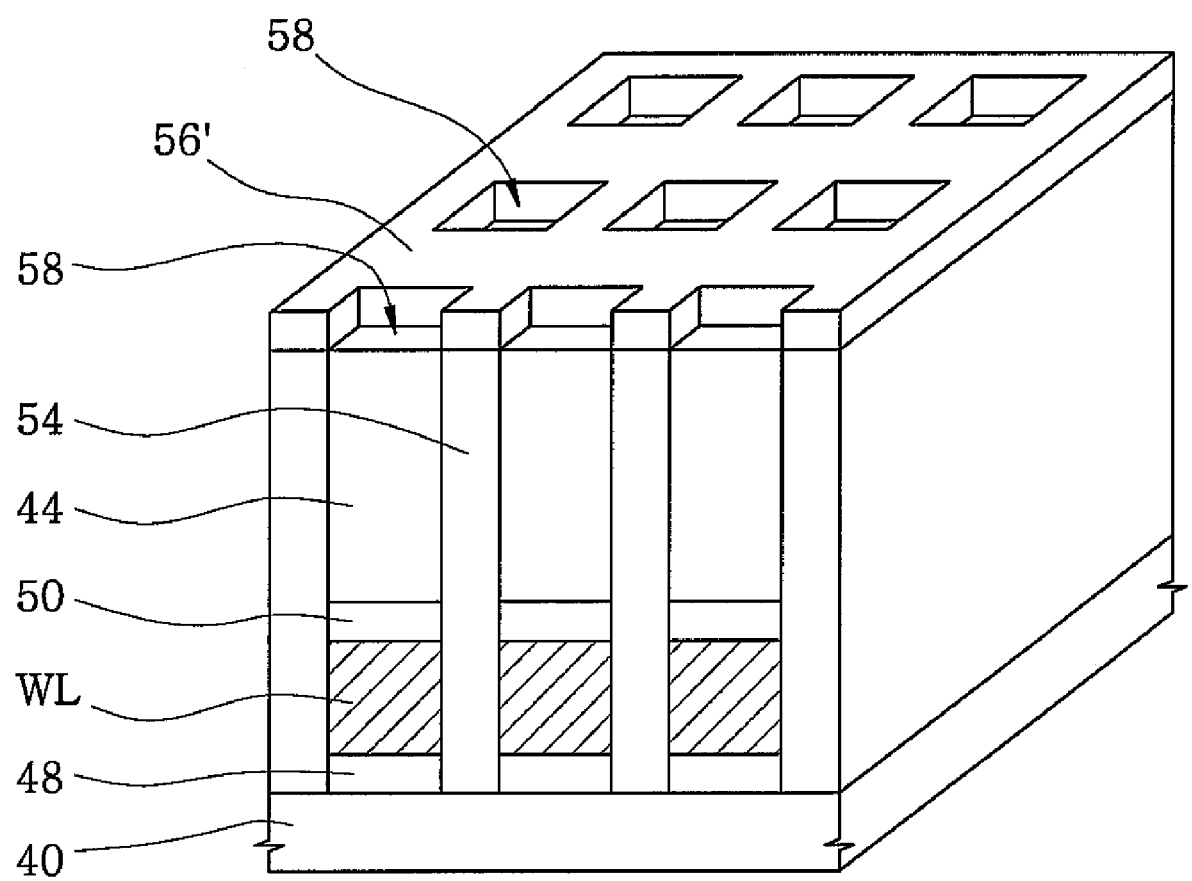

Referring to FIGS. 3 and 4G, the first hard mask patterns 46" are removed by an etch-back technique. Accordingly, a second hard mask pattern 56' is formed which has openings 58 exposing an upper surface of the lower insulating layer 44. The openings 58 have substantially the same widths as the widths of the word lines WL. In addition, the openings 58 may be arranged two-dimensionally along rows and columns corresponding to the first hard mask patterns 46". In an exemplary embodiment, the openings 58 may have rectangular shapes when seen in a plan view.

Figure 4H:
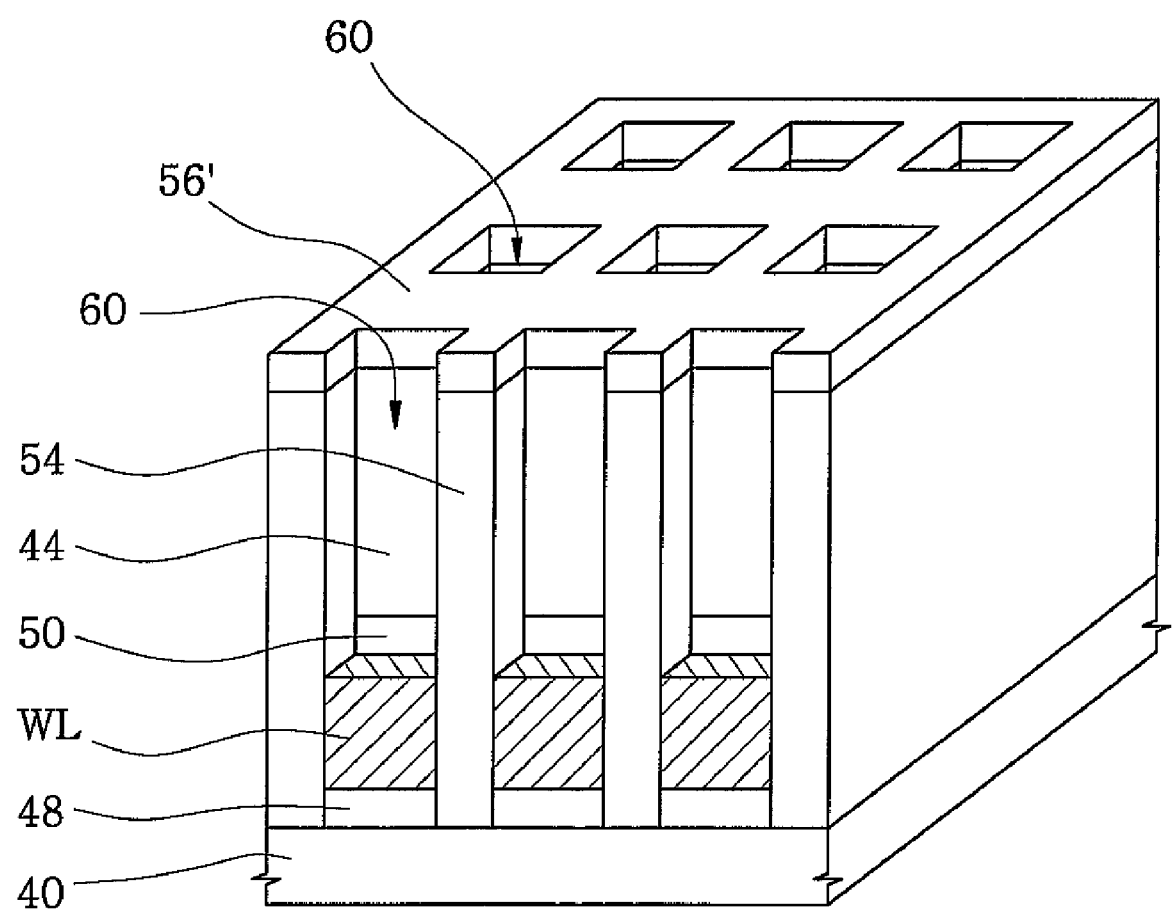

Referring to FIGS. 3 and 4H, the lower insulating layer 44 is etched using the second hard mask pattern 56' as an etch mask to form cell contact holes 60 exposing an upper surface of the word lines WL. In an exemplary embodiment, the lower insulating layer 44 may be etched by an anisotropic etching technique. Accordingly, the cell contact holes 60 have substantially the same widths as the widths of the word lines WL. In addition, the cell contact holes 60 are defined by the isolation layer 54 and the lower insulating layer 44. That is, the cell contact holes 60 are surrounded by sidewalls of the isolation layer 54 and the lower insulating layer 44. In an exemplary embodiment, the cell contact holes 60 may be arranged two-dimensionally along rows and columns corresponding to the openings 58. In addition, the cell contact holes 60 may have rectangular shapes when seen in a plan view.

When the etch stop layer 50 is formed between the word line WL and the lower insulating layer 44, the etch stop layer 50 may be removed after the lower insulating layer 44 is etched.

Figure 4I:
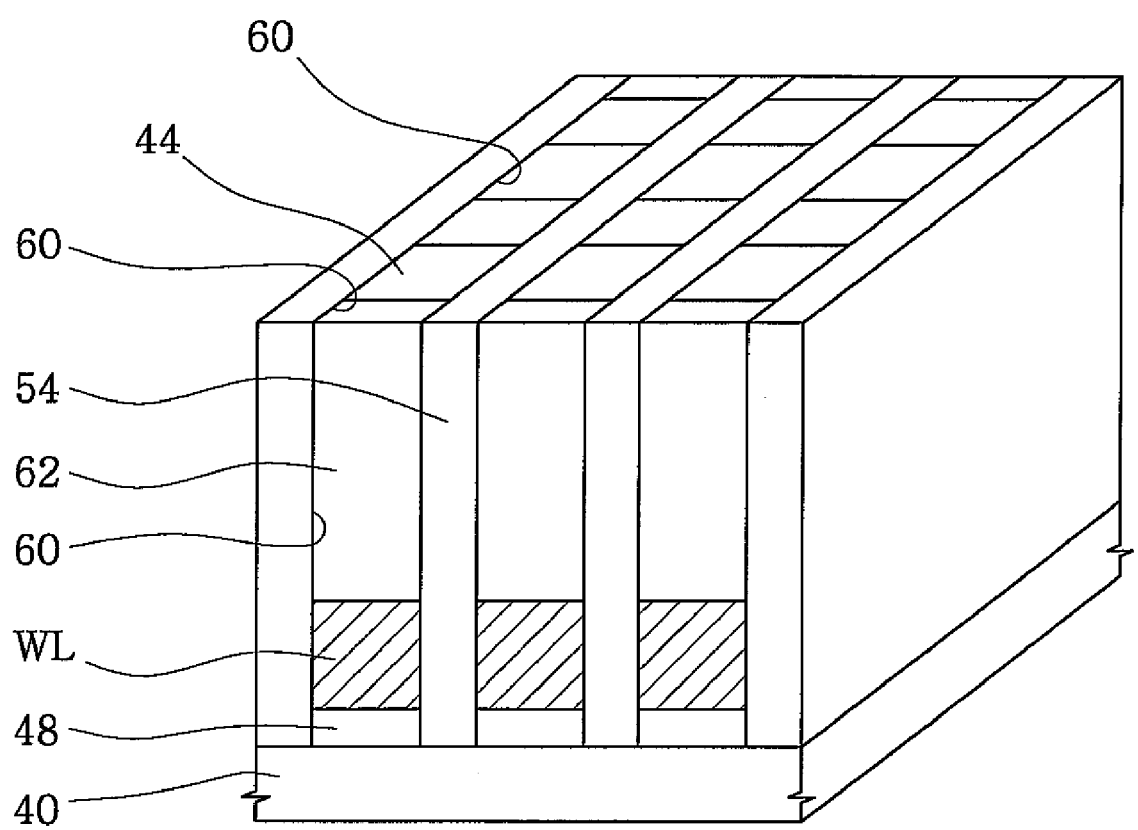

Referring to FIGS. 3 and 4I, the second hard mask pattern 56' is removed to expose upper surfaces of the lower insulating layer 44 and the isolation layer 54. Subsequently, a semiconductor layer is formed on the substrate having the cell contact holes 60. Accordingly, the semiconductor layer may fill the cell contact holes 60. In an exemplary embodiment, the semiconductor layer may be formed by a chemical vapor deposition (CVD) technique. Furthermore, the semiconductor layer is planarized by a CMP technique to expose the upper surfaces of the lower insulating layer 44 and the isolation layer 54. Accordingly, preliminary semiconductor patterns 62 are formed to fill the cell contact holes 60. In this case, the preliminary semiconductor patterns 62 are self-aligned with the word lines WL by the cell contact holes 60 because of the use of the first and second hard mask patterns 46" and 56' overlapping the word line WL.

In an exemplary embodiment, the semiconductor layer may be formed of a polysilicon layer. Furthermore, when the semiconductor layer is formed of the polysilicon layer, the second hard mask pattern may not be removed.

Figure 4J:
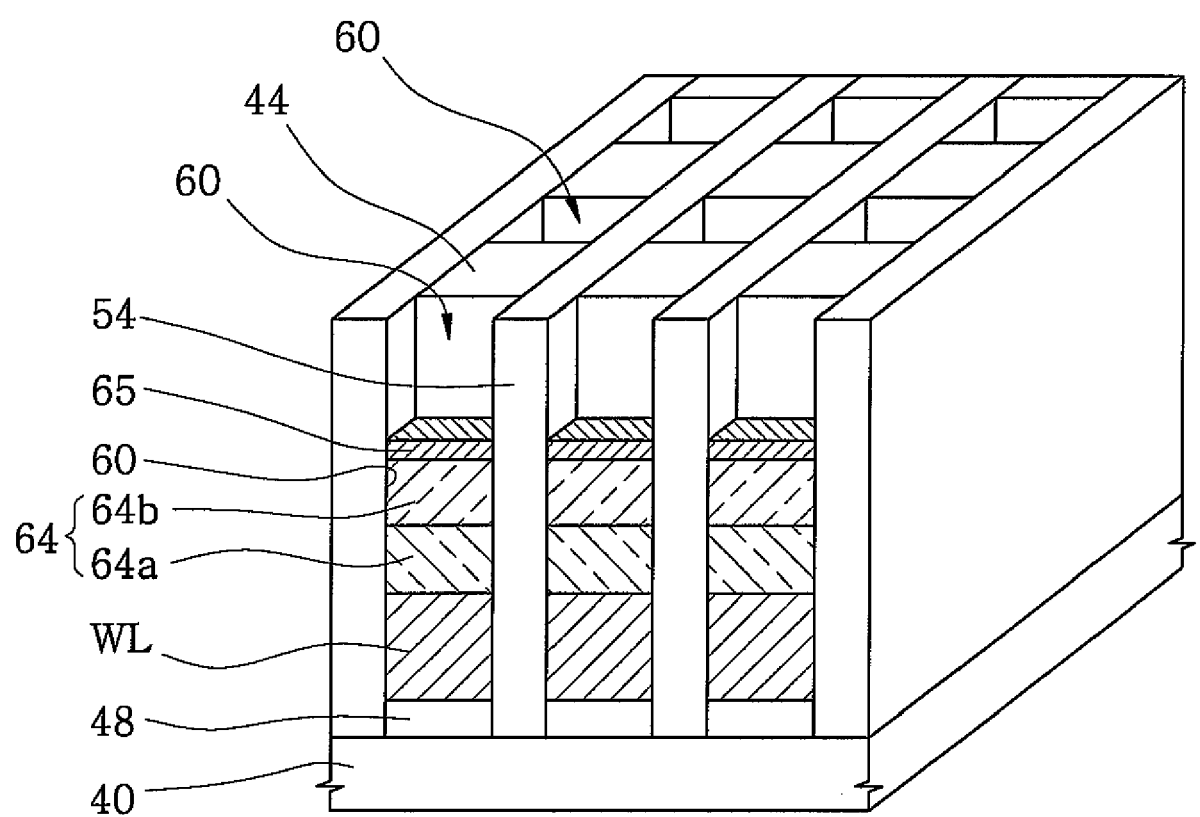

Referring to FIGS. 3 and 4J, the preliminary semiconductor patterns 62 are partially etched to form recessed semiconductor patterns. These recessed semiconductor patterns may have upper surfaces lower than the upper surfaces of the isolation layer 54 and the lower insulating layer 44. Furthermore, impurity ions of the first conductivity type or the second conductivity type are implanted into lower regions of the recessed semiconductor patterns to form first semiconductor patterns 64a. In addition, impurity ions of the first conductivity type are implanted into the upper regions of the recessed semiconductor patterns to form second semiconductor patterns 64b. In an exemplary embodiment, the ion implantation process for forming the first semiconductor patterns 64a may be carried out after the ion implantation process for forming the second semiconductor patterns 64b.

When the first semiconductor patterns 64a are doped with the impurity ions of the same conductivity type as the word line, the first and second semiconductor patterns 64a and 64b which are sequentially stacked in the cell contact holes 60 form cell diodes 64. Alternatively, when the first semiconductor patterns 64a are doped with the impurity ions of a different conductivity type from the word line WL, the word lines WL and the first semiconductor patterns 64a form cell diodes.

In this case, the cell diodes 64 are self-aligned with the word lines WL by the cell contact holes 60. Therefore, an increase in contact resistance due to the misalignment between the word lines and the cell diodes may be prevented.

Alternatively, the semiconductor layer may be formed using a selective epitaxial growth technique employing the word lines WL exposed by the cell contact holes 60 as a seed. Accordingly, the semiconductor layer may be formed to have a single crystalline structure when the word lines WL have a single crystalline structure. Furthermore, the semiconductor layer may be planarized to form a preliminary semiconductor pattern having a flat surface at the same level as the upper surfaces of the isolation layer 54 and the lower insulating layer 44. In an exemplary embodiment, the semiconductor layer may be a silicon layer when the selective epitaxial growth process is carried out using a silicon source gas.

Cell diode electrodes 65 may be formed on the cell diodes 64. The cell diode electrodes 65 are self-aligned with the cell diodes 60 by the cell contact holes 60. In an exemplary embodiment, the cell diode electrodes 65 may be formed of a metal silicide layer such as a cobalt silicide layer.

Figure 4K:
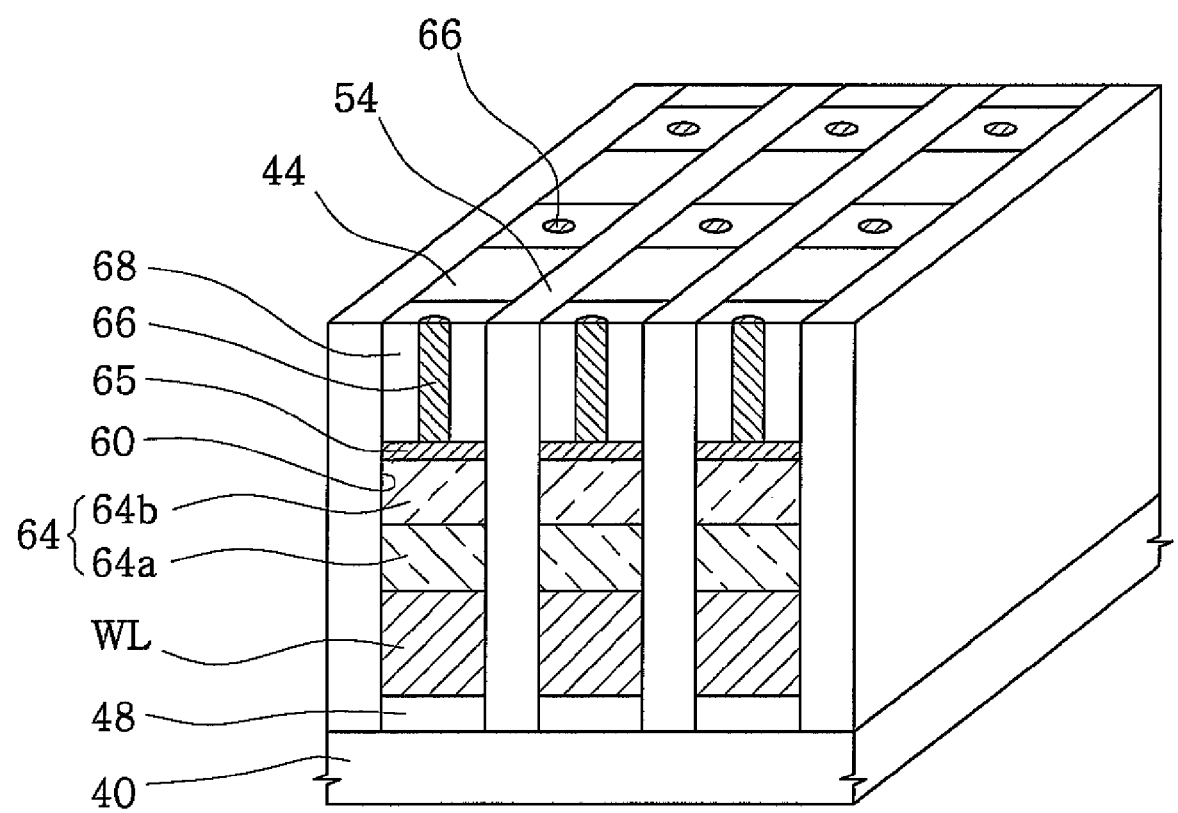

Referring to FIGS. 3 and 4K, insulating spacers 68 may be formed on upper regions of the cell contact holes 60. In this case, outer sidewalls of the insulating spacers 68 are self-aligned with sidewalls of the cell diodes 64 by the cell contact holes 60. The insulating spacers 68 may be formed of an insulating layer such as, for example, a silicon oxide layer or a silicon nitride layer.

Lower electrodes 66 are formed on upper regions of the cell contact holes 60. The lower electrodes 66 are surrounded by inner sidewalls of the insulating spacers 68. Furthermore, the lower electrodes 66 are formed to have lower surfaces in contact with the cell diode electrodes 65. In addition, the lower electrodes 66 may be formed to have upper surfaces at the same level as the upper surfaces of the isolation layer 54, the lower insulating layer 44, and the insulating spacers 68. Alternatively, the lower electrodes 66 may have the upper surfaces at a lower level than the upper surfaces of the isolation layer 54, the lower insulating layer 44, and the insulating spacers 68. The lower electrodes 66 may be formed of a titanium layer, a tantalum layer, a titanium nitride layer, a titanium aluminum nitride layer, a tantalum nitride layer, or a combination thereof. For example, when the cell diode electrodes 65 are formed of a cobalt silicide layer, the lower electrodes 66 may be formed of a conductive layer composed of a titanium layer and a titanium nitride layer which are sequentially stacked for an ohmic contact occurring between the cell diode electrodes 65 and the lower electrodes 66.

Figure 4L:
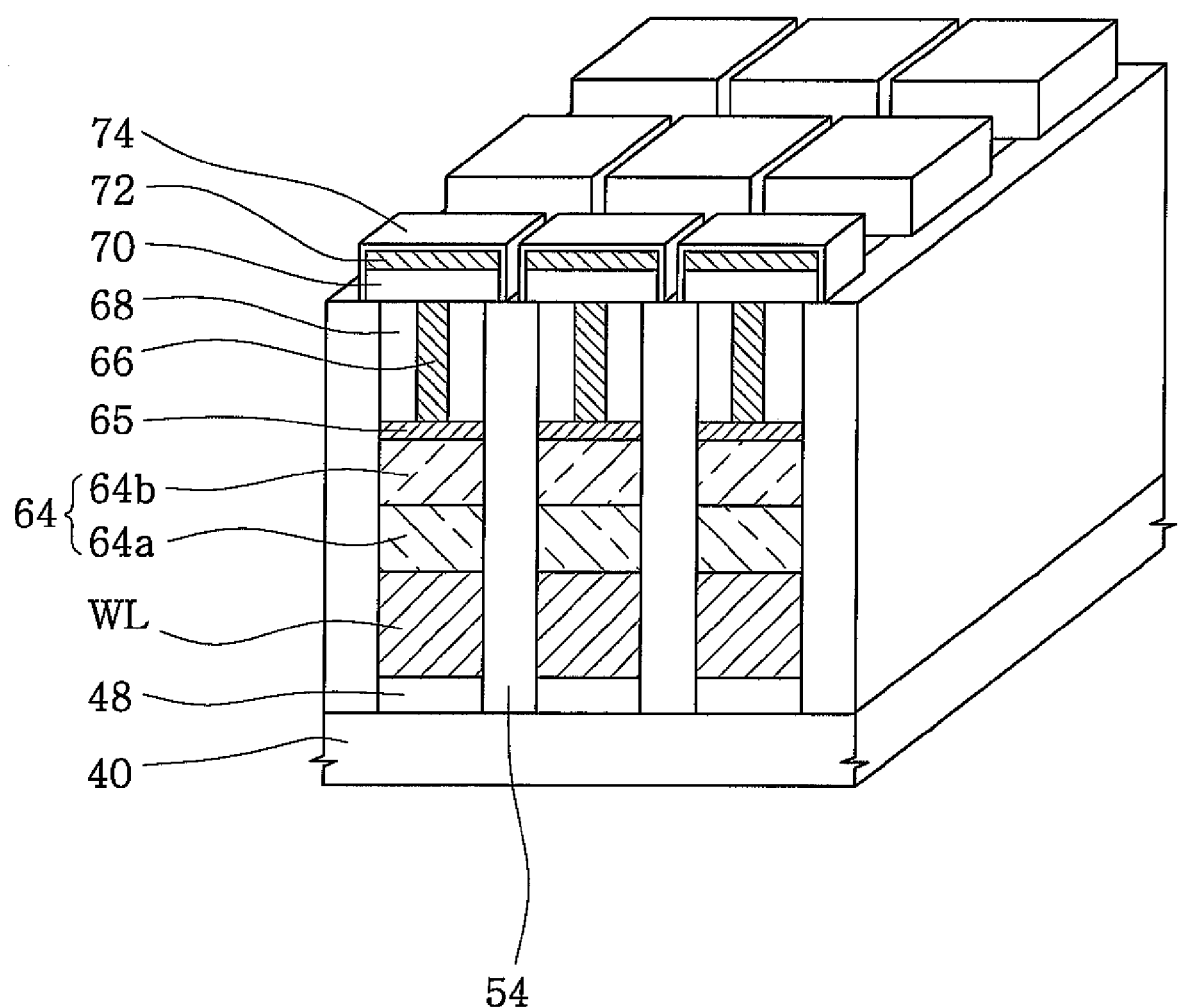

Referring to FIGS. 3 and 4L, a phase change material layer is formed on the substrate having the lower electrodes 66. In particular, the phase change material layer is formed to be in contact with the upper surfaces of the lower electrodes 66. In this case, a conductive barrier layer may be formed on the phase change material layer. In an exemplary embodiment, the phase change material layer may be formed of a chalcogenide layer such as a GST layer. In addition, the conductive barrier layer may be formed of a conductive layer which does not react with the phase change material layer. For example, the conductive barrier layer may be formed of a conductive layer such as a titanium nitride layer, a tantalum nitride layer, a tungsten nitride layer, or a titanium aluminum nitride layer.

The conductive barrier layer and the GST layer may be sequentially patterned to form phase change material patterns 70 and conductive barrier layer patterns 72 on the lower electrodes 66. In an exemplary embodiment, the phase change material patterns 70 may have larger widths than the widths of the lower electrodes 66. Furthermore, the phase change material patterns 70 may be arranged two-dimensionally along rows and columns.

In addition, a capping insulating layer 74 may be formed to cover the phase change material patterns 70 and the conductive barrier layer patterns 72. The capping insulating layer 74 may be formed of an insulating layer which does not react with the phase change material layer. For example, the capping insulating layer 74 may be formed of a silicon nitride layer or a silicon oxynitride layer.

Figure 4M:
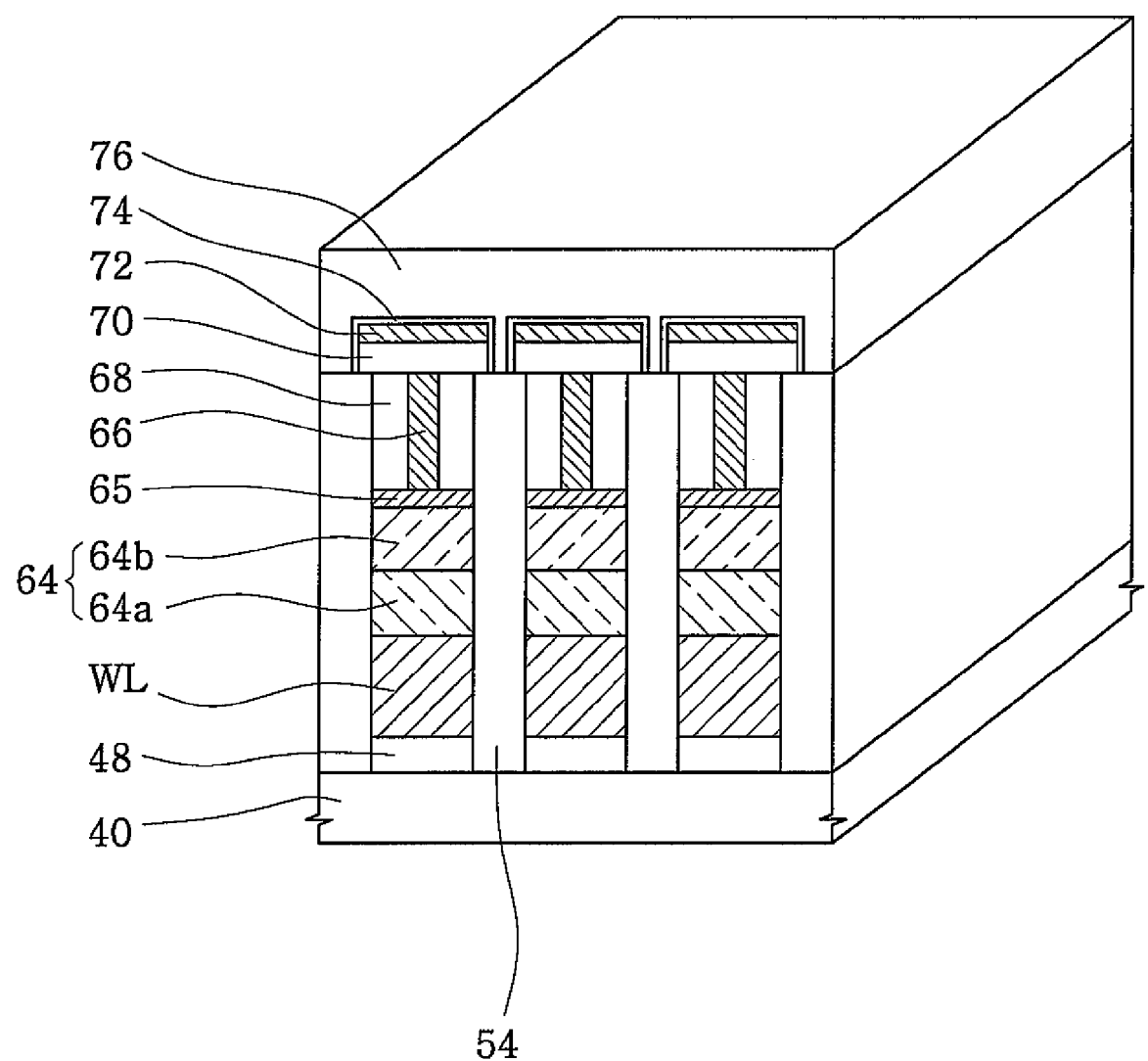

Referring to FIGS. 3 and 4M, an upper insulating layer 76 is formed on the capping insulating layer 74. The upper insulating layer 76 may be formed of an insulating layer which does not react with the GST layer. For example, the upper insulating layer 76 may be formed of an insulating layer such as a silicon oxide layer, a silicon nitride layer, or a combination thereof.

Figure 4N:
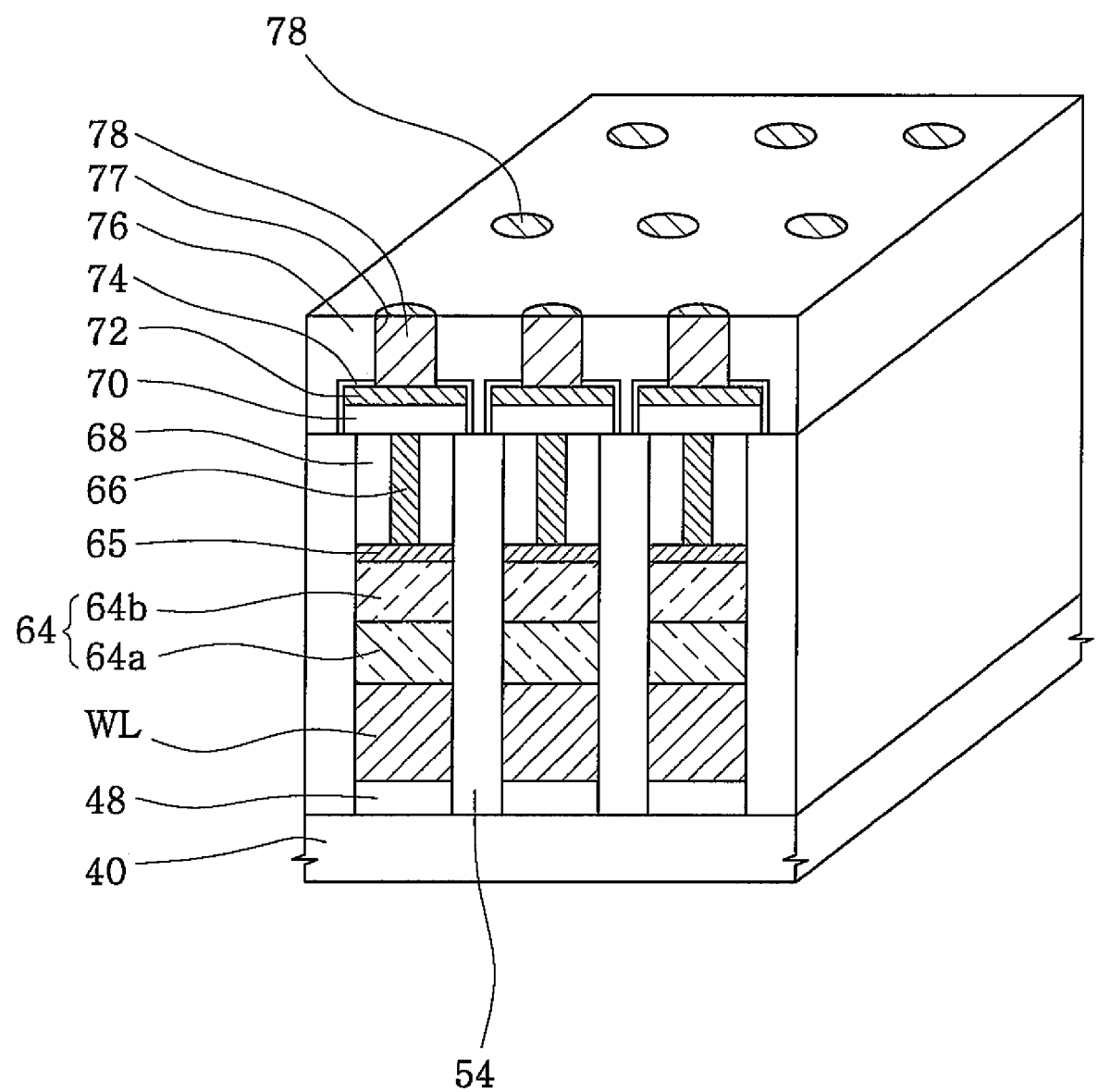
Figure 4O:
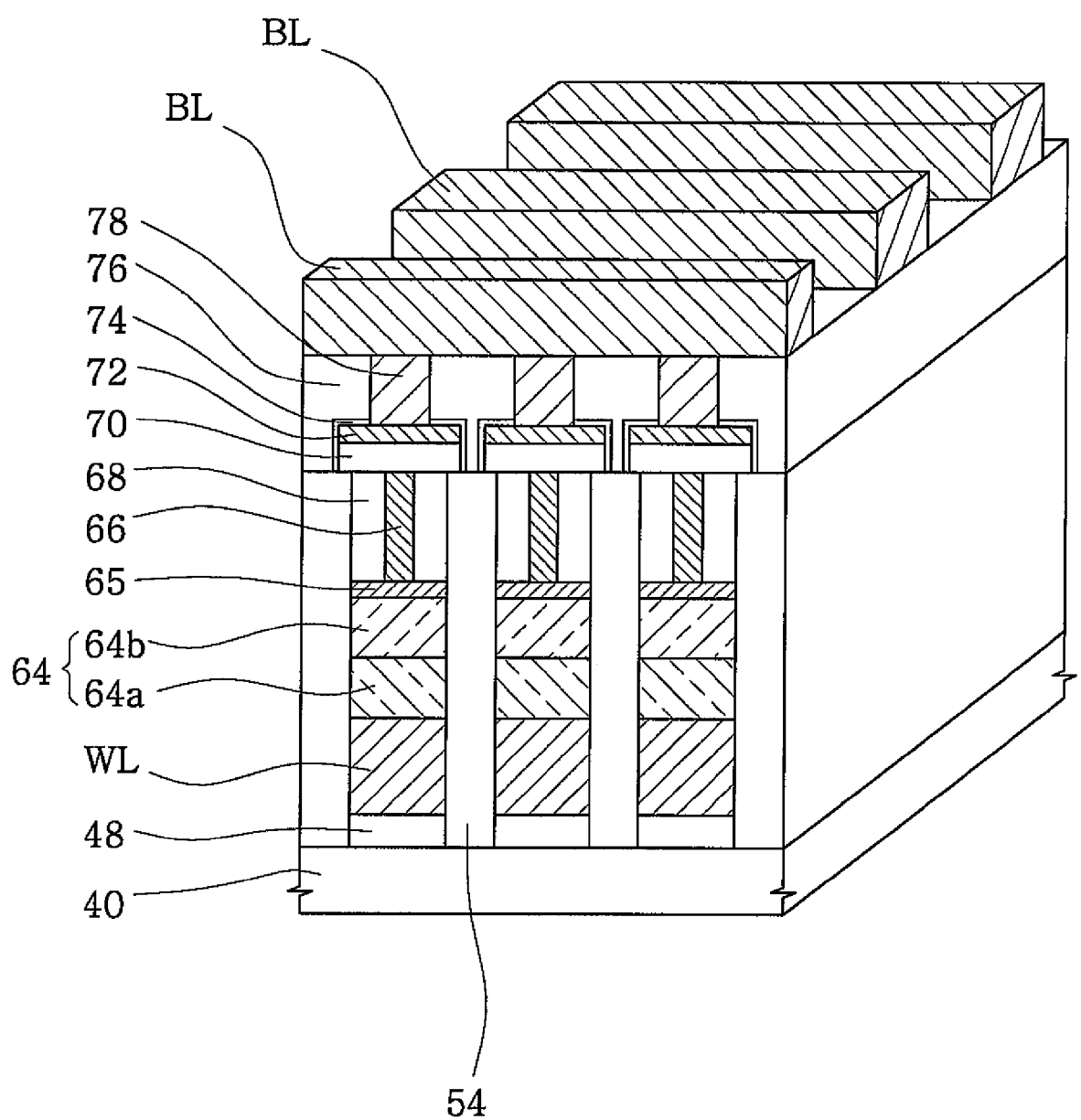

Referring to FIGS. 3 and 4N, the upper insulating layer 76 and the capping insulating layer 74 may be sequentially patterned to form openings 77. These openings 77 may expose upper surfaces of the conductive barrier layer patterns 72. Furthermore, a conductive layer is formed on the upper insulating layer 76 to fill the openings 77. The conductive layer may be formed of a metal layer such as tungsten or titanium. In addition, the conductive layer is etched by an etch-back technique or planarized by a CMP technique to expose the upper surface of the upper insulating layer 76 and to form upper electrodes 78. Accordingly, the upper electrodes 78 are formed in the openings 77.

Referring to FIG. 4O, bit lines BL are formed on the upper insulating layer having the upper electrodes 78. The bit lines BL may electrically connect the phase change material patterns 70 through the upper electrodes 78. Furthermore, the bit lines BL may cross the word lines WL. The word lines WL and the bit lines BL form semiconductor devices 80. As described above, these semiconductor devices 80 may include a phase change memory device.

As described above, the present disclosure provides a method of fabricating a semiconductor device having a self-aligned cell diode and a method of fabricating a phase change memory device using the same. When a current is applied to a phase change memory device fabricated in the above-described manner, an increase in contact resistance due to the misalignment between word lines and cell diodes can be prevented because of the self-alignment of the cell diode with the word lines.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
    forming a conductive layer on a semiconductor substrate;
    forming an insulating layer on the conductive layer;
    patterning the insulating layer and the conductive layer to form a plurality of stacked structures separated by isolations trenches, wherein each of the stacked structures includes a patterned portion of the conductive layer which defines a word line and a corresponding patterned portion of the insulating layer stacked on the word line;
    forming an isolation layer that fills the isolation trenches;
    forming a cell contact hole in each of the patterned portions of the insulating layer such that the cell contact hole is self-aligned between the isolation trenches and with a corresponding word line so as to expose the corresponding word line; and
    forming a cell diode in the cell contact hole.

2. A method of fabricating a semiconductor device, comprising:
    forming a conductive layer on a semiconductor substrate;
    forming an insulating layer on the conductive layer;
    forming a word line and isolation trenches by patterning the insulating layer and the conductive layer;
    forming an isolation layer that fills the isolation trenches;
    forming a cell contact hole in the insulating layer such that the cell contact hole is self-aligned with the word line and exposes the word line; and
    forming a cell diode in the cell contact hole
    wherein forming the word line and the isolation trenches comprises:
    forming a first hard mask layer on the insulating layer;
    patterning the first hard mask layer to form a first preliminary hard mask pattern on the insulating layer, the first preliminary hard mask pattern overlapping the word line between the isolation trenches; and
    etching the insulating layer and the conductive layer using the first preliminary hard mask pattern as an etch mask.

3. The method according to claim 2, wherein forming the cell contact hole comprises:
    patterning the first preliminary hard mask pattern to form a first hard mask pattern, such that the first hard mask pattern overlaps the word line to expose the insulating layer and the isolation layer;
    forming a second hard mask layer on the substrate having the first hard mask pattern;
    planarizing the second hard mask layer to expose the first hard mask pattern;
    removing the first hard mask pattern to form a second hard mask pattern; and etching the insulating layer using the second hard mask pattern as an etch mask.

4. The method according to claim 3, wherein the second hard mask layer is formed to have an etch selectivity with respect to the first hard mask layer.

5. The method according to claim 4, wherein the first and second hard mask layers are formed of a silicon nitride layer and a polysilicon layer, respectively.

6. The method according to claim 5, wherein a width of the first hard mask pattern is the same as that of the word line.

7. The method according to claim 6, wherein the cell diode includes the word line and a semiconductor layer stacked thereon, the semiconductor layer having a different conductivity type from the word line.

8. The method according to claim 6, wherein the cell diode includes a semiconductor layer stacked on the word line, wherein the semiconductor layer includes semiconductor patterns having different conductivity types.

9. A method of fabricating a phase change memory device, comprising:
   forming a conductive layer on a semiconductor substrate;
   forming a lower insulating layer on the conductive layer;
   forming a first preliminary hard mask pattern on the lower insulating layer;
   etching the lower insulating layer and the conductive layer using the first preliminary hard mask pattern as an etch mask to form a word line and a plurality of isolation trenches,
   forming an isolation layer that fills the isolation trenches;
   patterning the first preliminary hard mask pattern to form a first hard mask pattern;
   forming a second hard mask layer on the isolation layer and the lower insulating layer to surround the first hard mask pattern;
   removing the first hard mask pattern from the second hard mask layer to form a second hard mask pattern;
   etching the lower insulating layer using the second hard mask pattern as an etch mask to form a cell contact hole, the cell contact hole being self-aligned with the word line and exposing the word line; and
   forming a cell diode at least partially filling the cell contact hole.

10. The method according to claim 9, further comprising forming an insulating spacer and a lower electrode on the cell diode to at least partially fill the cell contact hole.

11. The method according to claim 10, wherein the insulating spacer is formed to surround the lower electrode.

12. The method according to claim 11, further comprising forming a cell diode electrode between the cell diode and the insulating spacer to contact the lower electrode.

13. The method according to claim 12, wherein the second hard mask layer is formed to have an etch selectivity with respect to the first hard mask pattern.

14. The method according to claim 13, wherein surrounding the first hard mask pattern includes forming the second hard mask layer on the insulating layer and the isolation layer to cover the first hard mask pattern, and planarizing the second hard mask layer to expose the first hard mask pattern.

15. The method according to claim 14, wherein the first and second hard mask layers are formed of a silicon nitride layer and a polysilicon layer, respectively.

16. The method according to claim 15, wherein forming the preliminary first hard mask pattern includes forming a first hard mask layer on the insulating layer, and etching the first hard mask layer to expose the insulating layer.

17. The method according to claim 16, further comprising:
   forming a phase change material pattern and an upper electrode on the lower electrode, the phase change material pattern contacting the lower electrode;
   forming an upper insulating layer to cover the phase change material pattern and the upper electrode; and
   forming a bit line on the upper insulating layer to electrically connect the upper electrode.

18. The method according to claim 17, wherein the cell diode includes the word line and a semiconductor layer stacked thereon, the semiconductor layer having a different conductivity type from the word line.

19. The method according to claim 17, wherein the cell diode includes a semiconductor layer stacked on the word line, the semiconductor layer includes semiconductor patterns having different conductivity types.

* * * * *